United States Patent
Le et al.

(10) Patent No.: US 8,778,198 B2
(45) Date of Patent: Jul. 15, 2014

(54) METHOD FOR MANUFACTURING A MAGNETORESISTIVE SENSOR USING SIMULTANEOUSLY FORMED HARD BIAS AND ELECTRICAL LAPPING GUIDE

(75) Inventors: Quang Le, San Jose, CA (US); Shin Funada, Pleasanton, CA (US); Jui-Lung Li, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 409 days.

(21) Appl. No.: 13/172,739

(22) Filed: Jun. 29, 2011

(65) Prior Publication Data

US 2013/0001187 A1    Jan. 3, 2013

(51) Int. Cl.
*B44C 1/22* (2006.01)

(52) U.S. Cl.
USPC ............... 216/22; 216/75; 438/712; 438/742

(58) Field of Classification Search
USPC ............................. 438/712, 742; 216/22, 75
See application file for complete search history.

(56) References Cited

U.S. PATENT DOCUMENTS

| | | | |
|---|---|---|---|
| 6,786,803 B2 | 9/2004 | Crawforth et al. | |
| 7,206,172 B2 | 4/2007 | Ding et al. | |
| 7,287,316 B2 | 10/2007 | Kasahara et al. | |
| 7,360,296 B2 | 4/2008 | Cyrille et al. | |
| 7,631,416 B2 | 12/2009 | Ohta et al. | |
| 2003/0137780 A1* | 7/2003 | Fontana et al. | 360/324.2 |
| 2007/0035891 A1* | 2/2007 | Freitag et al. | 360/324.11 |
| 2008/0062576 A1* | 3/2008 | Heim et al. | 360/314 |
| 2008/0253033 A1 | 10/2008 | Ohta et al. | |
| 2008/0274623 A1* | 11/2008 | Guthrie et al. | 438/712 |
| 2009/0286106 A1* | 11/2009 | Gill et al. | 428/811.2 |
| 2009/0323222 A1 | 12/2009 | Hirata et al. | |
| 2011/0027618 A1* | 2/2011 | Lee et al. | 428/811.2 |

FOREIGN PATENT DOCUMENTS

| | | |
|---|---|---|
| JP | 2003/142756 A | 5/2003 |
| JP | 2005/294610 A | 10/2005 |

* cited by examiner

*Primary Examiner* — Binh X Tran
(74) *Attorney, Agent, or Firm* — Zilka-Kotab, PC`

(57) ABSTRACT

A method for manufacturing a magnetic sensor using an electrical lapping guide deposited and patterned simultaneously with a hard bias structure of the sensor material. The method includes depositing a sensor material, and patterning and ion milling the sensor material to define a track width of the sensor. A magnetic, hard bias material is then deposited and a second patterning and ion milling process is performed to simultaneously define the back edge of an electrical lapping guide and a back edge of the sensor.

13 Claims, 25 Drawing Sheets

METHOD FOR MANUFACTURING A MAGNETORESISTIVE SENSOR USING SIMULTANEOUSLY FORMED HARD BIAS AND ELECTRICAL LAPPING GUIDE

FIELD OF THE INVENTION

The present invention relates to magnetoresistive sensors and more particularly to a method for accurately controlling a stripe height of a sensor at very small sensor dimensions.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor, or a Tunnel Junction Magnetoresive (TMR) sensor can be employed to read a magnetic signal from the magnetic media. The sensor includes a nonmagnetic conductive layer (if the sensor is a GMR sensor) or a thin nonmagnetic, electrically insulating barrier layer (if the sensor is a TMR sensor) sandwiched between first and second ferromagnetic layers, hereinafter referred to as a pinned layer and a free layer. Magnetic shields are positioned above and below the sensor stack and can also serve as first and second electrical leads so that the electrical current travels perpendicularly to the plane of the free layer, spacer layer and pinned layer (current perpendicular to the plane (CPP) mode of operation). The magnetization direction of the pinned layer is pinned perpendicular to the air bearing surface (ABS) and the magnetization direction of the free layer is located parallel to the ABS, but free to rotate in response to external magnetic fields. The magnetization of the pinned layer is typically pinned by exchange coupling with an antiferromagnetic layer.

When the magnetizations of the pinned and free layers are parallel with respect to one another, scattering of the conduction electrons is minimized and when the magnetizations of the pinned and free layer are antiparallel, scattering is maximized. In a read mode the resistance of the spin valve sensor changes about linearly with the magnitudes of the magnetic fields from the rotating disk. When a sense current is conducted through the spin valve sensor, resistance changes cause potential changes that are detected and processed as playback signals.

The depth of the magnetoresistive sensor as measured perpendicular to the air bearing surface is referred to as the stripe height of the sensor. This stripe height is an important dimension of the sensor and is defined by a lapping process that removes sensor material until a desired air bearing surface location has been reached. In order to determine when lapping should be terminated, an electrical lapping guide can be used to determine how far the lapping has progressed. However, certain design structures, necessary to make a sensor workable at very small sizes has rendered the construction and use of such lapping guides inaccurate and unreliable. Therefore, there is a need for a process that can allow the location of the air bearing surface (and lapping termination point) to be determined with accuracy for a very small magnetoresistive sensor.

SUMMARY OF THE INVENTION

The present invention provides a method for manufacturing a magnetoresitive sensor that includes forming a magnetoresistive sensor having a first and second hard bias layers constructed of a magnetic material and forming an electrical lapping guide comprising the same magnetic material as the hard bias layers.

The hard bias layers and the electrical lapping guide can be formed in the same patterning and ion milling process. The sensor and electrical lapping guide can be formed by depositing a sensor material and then forming a first mask over the sensor material, the first mask being configured to define a width of the sensor. A magnetic material can then be deposited to provide hard magnetic bias structures in the sensor region and to also provide a layer of hard bias material in an electrical lapping guide region. Then, a second mask is formed having a back edge configured to define a back edge of a sensor in the sensor region and also having a back edge configured to define a back edge of an electrical lapping guide in an electrical lapping guide region. An ion milling can then be performed to simultaneously define a sensor back edge and an electrical lapping guide back edge.

The ion milling can advantageously be performed to remove all of the exposed hard bias material to form a well defined electrical lapping guide back edge, while leaving a portion of exposed sensor material extending from the back edge of the sensor as a sensor tail. This is possible because of the different materials of the sensor and hard bias material (which makes up the electrical lapping guide), which allows the ion milling to remove the hard bias material at a faster rate than the sensor material. This advantageously allows the AFM layer of the sensor to extend beyond the stripe height for improved pinning strength, while allowing the electrical lapping guide to be well defined for improved stripe height definition during lapping.

In addition, because the hard bias material is more opaque than the sensor material, the reflectivity problems associated with the different substrates of the sensor and electrical lapping guide (e.g. metal shield under sensor and alumina under the electrical lapping guide) are no longer an issue to with regard to photolithographic patterning.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
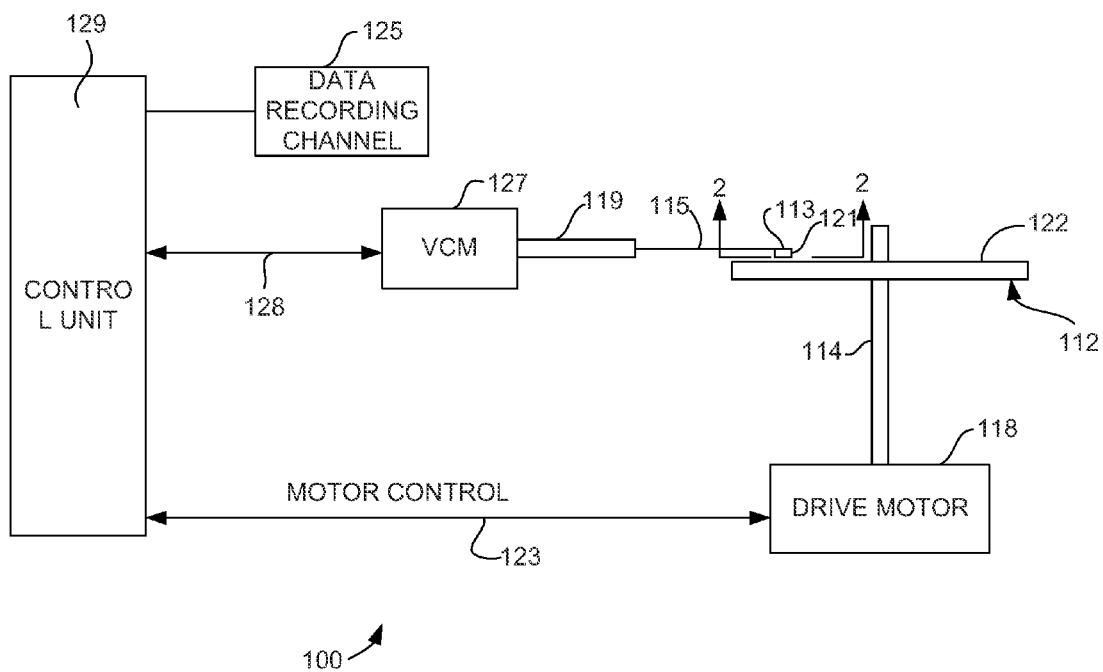
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
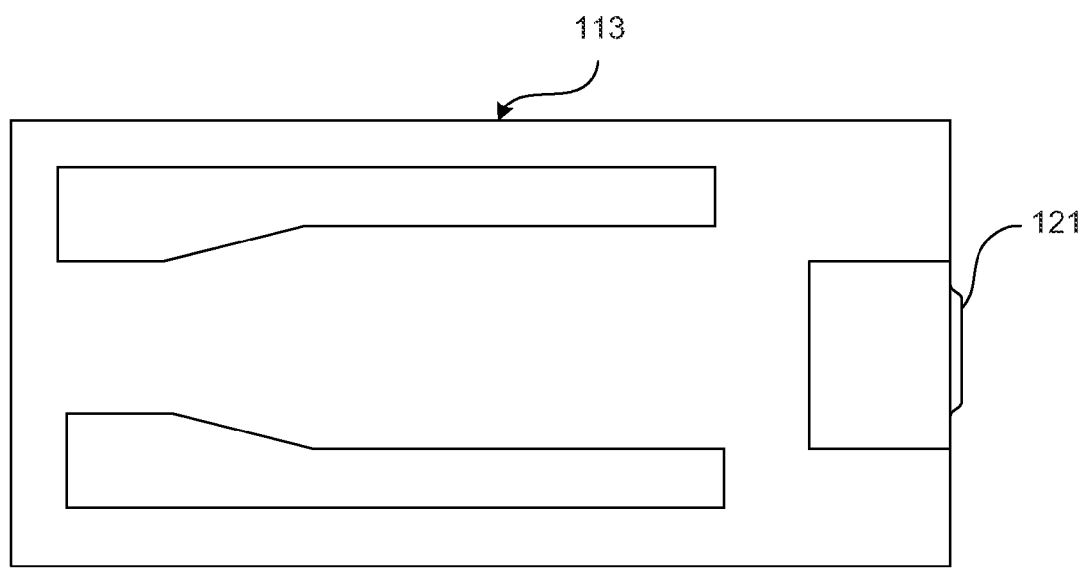
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head, including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
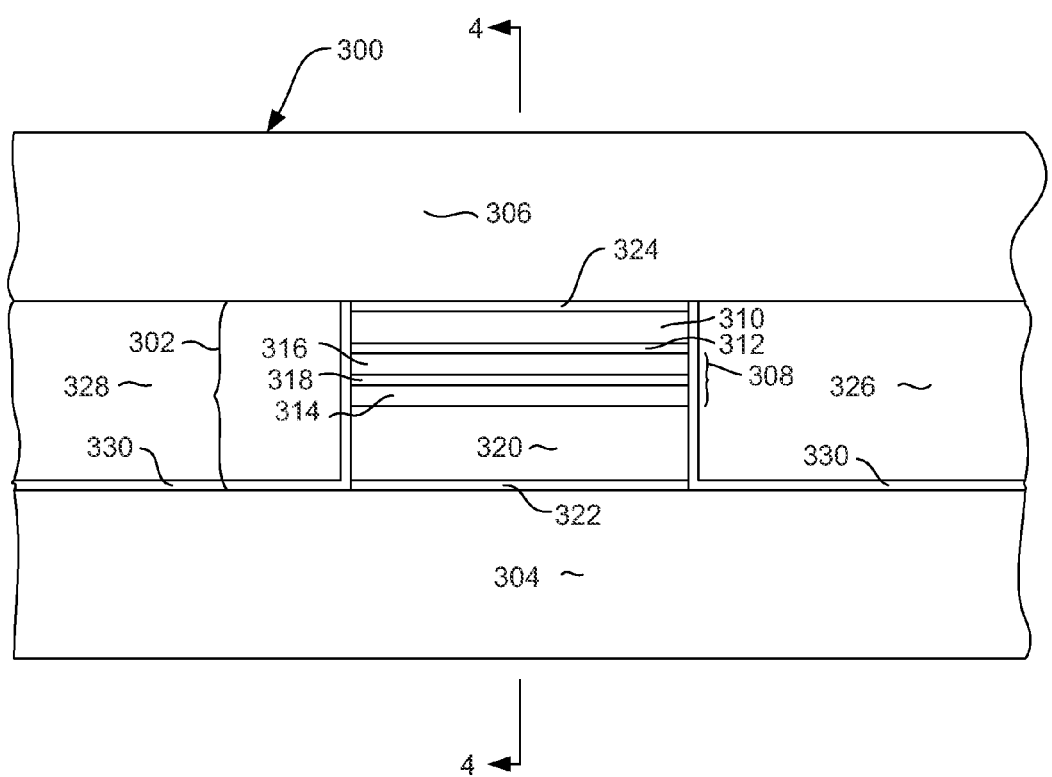
FIG. 3 is an ABS view of an example of a magnetoresistive sensor that might be constructed by a method of the present invention.

FIG. 3 shows an example of a magnetoresistive sensor structure 300 that could be constructed according to a method of the present invention. The sensor structure 300 includes a sensor stack 302 that is sandwiched between first and second magnetic shields 304, 306 that are constructed of an electrically conductive magnetic material so that they function as electrical leads as well as magnetic shields. The sensor stack 302 includes a magnetic pinned layer structure 308, a magnetic free layer structure 310 and a non-magnetic barrier or spacer layer 312 sandwiched between the pinned layer structure 308 and free layer structure 310. The non-magnetic layer 312 can be an electrically conductive spacer layer constructed of a material such as Cu if the senor 300 is a giant magnetoresistive (GMR) sensor, and can be a thin electrically insulating layer if the sensor 300 is a tunnel junction magnetoresistive (TMR) senor. In addition to the pinned and free layer structures 310, 308, the sensor stack 302 can also include a seed layer 322 for promoting a desired grain structure in the above applied layers and a capping layer 324 at the top of the sensor stack for protecting the sensor layers during manufacture.

The pinned layer structure 308 can be an antiparallel pinned structure that includes first and second magnetic layers 314, 316, which are antiparallel coupled across a non-magnetic coupling layer such as Ru 318 sandwiched therebetween. The first magnetic layer 314 is exchange coupled with a layer of antiferromagnetic material (AFM layer) 320. This exchange coupling strongly pins the magnetization of the first magnetic layer 314 in a direction perpendicular with the ABS. Antiparallel coupling between the first and second magnetic layers 314, 316 then pins the magnetization of the second magnetic layer 316 in a direction opposite to that of the first magnetic layer 314.

The free layer 310 has a magnetization that is biased in a direction that is parallel with the ABS, but which can move in response to a magnetic field, such as from the magnetic medium 112 (FIG. 1). Biasing of the magnetic free layer magnetization is provided by first and second hard magnetic bias layers 326, 328, which can be constructed of a high coercivity magnetic material such as Co—Pt or Co—Pt—Cr. The hard bias layers 326, 328 are each separated from the sensor stack 302 and from the bottom shield/lead 304 by a thin, non-magnetic layer such as alumina 330.

Figure 4:
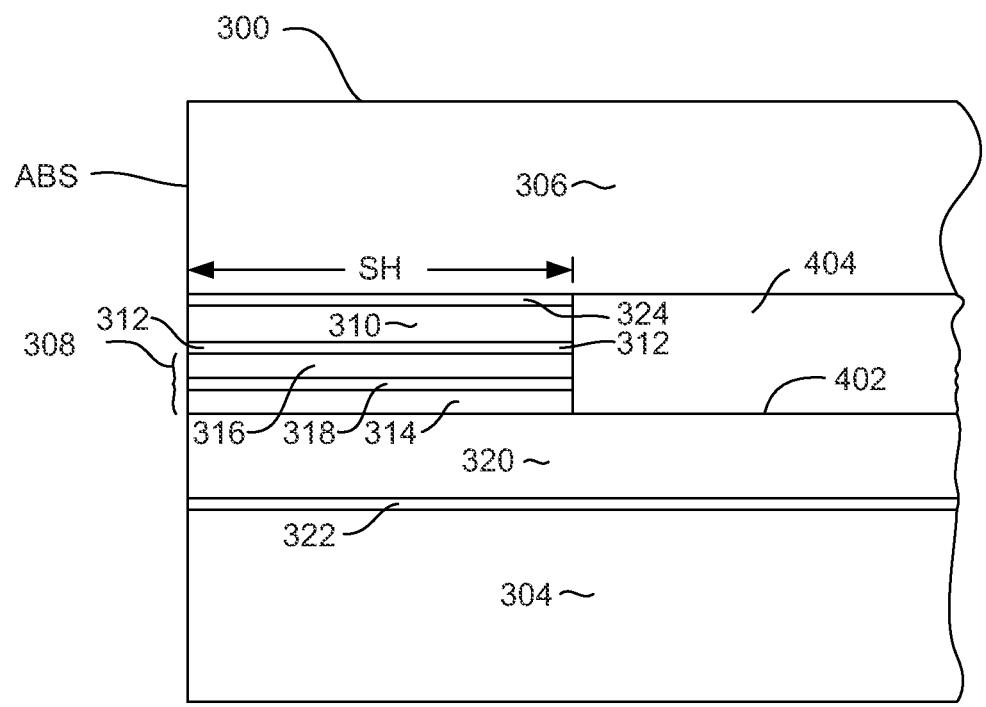
FIG. 4 is a side cross sectional view of a sensor constructed according to an embodiment of the invention.

As the size of the sensor decreases to accommodate higher data density requirements, the magnetic stability of the pinned layer suffers. In order to increase the stability of the magnetization of the pinned layer structure 308, the pinned layer structure 308 can be extended in the stripe height direction beyond the stripe height of the free layer 310. This is illustrated in FIG. 4 which shows a side, cross sectional view as seen from line 4-4 of FIG. 3. As can be seen, the upper portions of the sensor stack 302 such as the free layer 310 and spacer layer and pinned layers 308 extend to a stripe height SH as measured from the air bearing surface (ABS). However, the lower portions of the sensor stack 302 including the AFM layer 320 extend beyond this stripe height SH, thereby forming a sensor tail 402 that greatly enhances the robustness of the pinned layer structure 308. The region above the tail 402 can be filled with a non-magnetic dielectric fill layer 404 such as alumina.

As those skilled in the art will appreciate, the stripe height of the sensor 300 is ultimately defined by a lapping guide that is used to remove material until the ABS surface has been defined. The sensor 300 is formed along with many thousands of other sensors on a wafer. This wafer is then sliced into rows and a lapping or grinding operation is performed (from the left as shown in FIG. 4) until the location of the ABS has been reached. An electrical lapping guide can be used to determine the point at which the lapping operation should be terminated.

Figure 5:
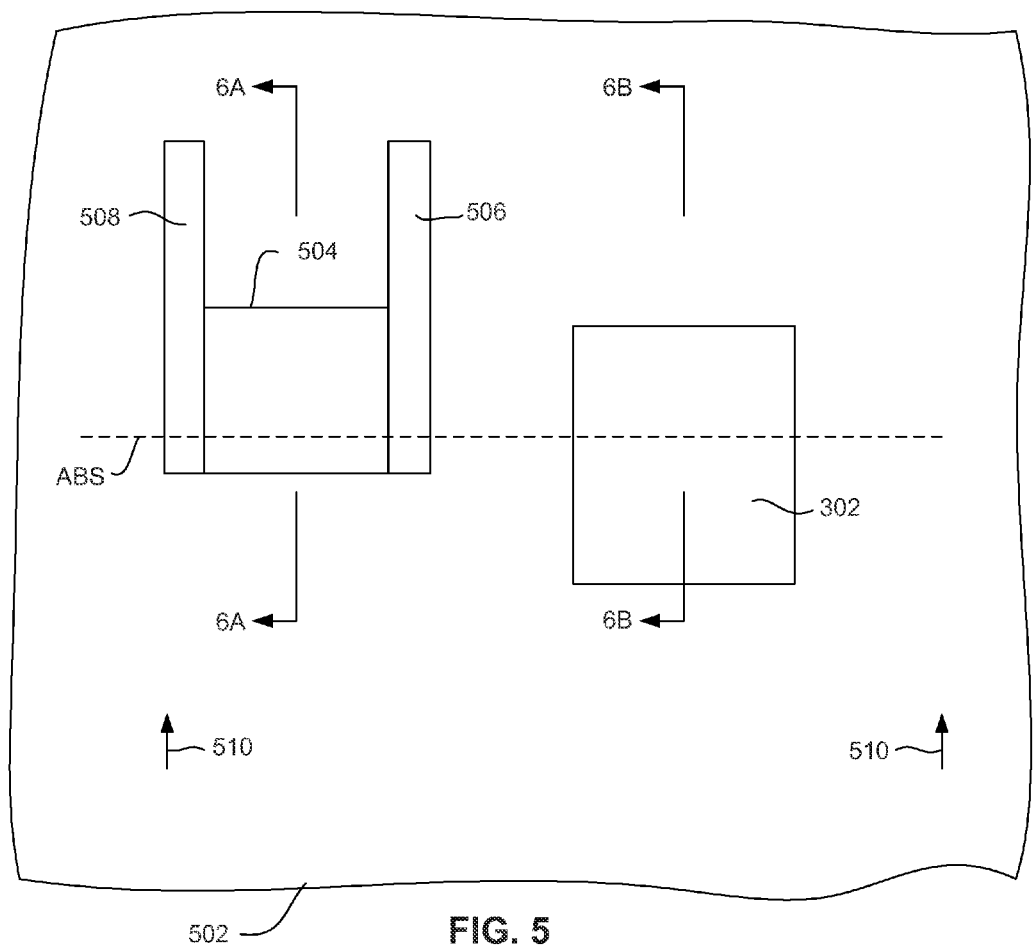
FIG. 5 is a top down view of a sensor and electrical lapping guide (ELG)

FIG. 5 shows a top down view of a portion of a wafer 502. As can be seen, the wafer includes a sensor stack 302 formed thereon and an electrical lapping guide 504 formed thereon. The lapping guide 504 is connected with electrically conductive leads 506, 508. The lapping guide 504 is constructed of a material that is electrically conductive but, which has an electrical resistance that can be measured across the leads 506, 508. During manufacture a lapping operation is performed to remove wafer material from the direction as indicated by arrows 510. It is desired that the lapping operation be terminated when the desired air bearing surface plane (ABS) is reached.

It can be seen that as the lapping operation reaches the lapping guide 504, the lapping guide material will be removed, which will in turn increase the electrical resistance of the lapping guide. When the electrical resistance of the lapping guide reaches a predetermined resistance value (indicating that the ABS plane has been reached) the lapping can be terminated. In order to ensure that the shape and location of the lapping guide 504 corresponds accurately with the sensor 302 (and more importantly that the back edge 512 is accurately located relative to the back edge 514 of the sensor 302) both the lapping guide 504 and sensor 302 can be defined in a common photolithographic masking and milling process that defines both the sensor and lapping guide. In this way there is no problem with misalignment between masks.

Figure 6A:
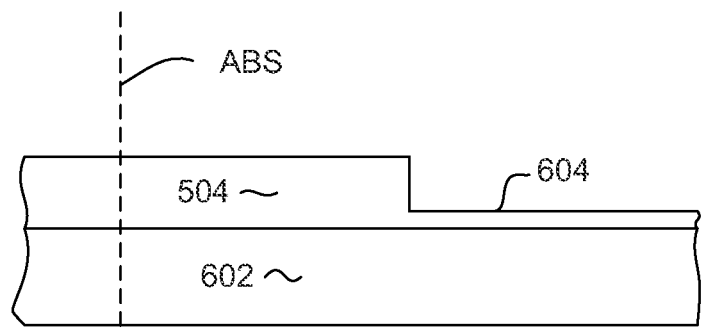
FIGS. 6A and 6B are side cross sectional views of a sensor and an ELG respectively and illustrate problems associated with prior art methods of forming a lapping guide.
Figure 6B:
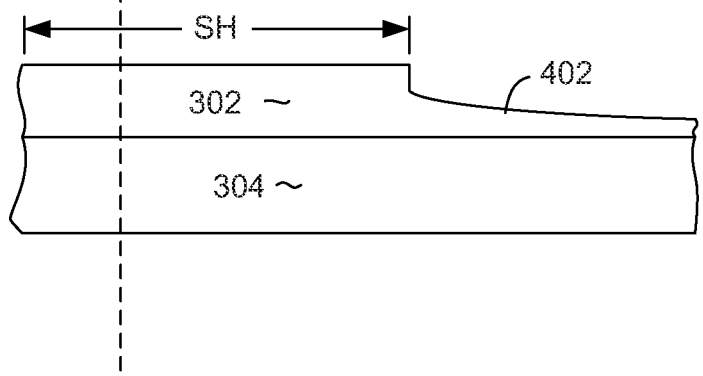

However this method of defining the lapping guide does present some challenges, which can be better explained with reference to FIG. 6. As will be recalled from the discussion of FIG. 3, the sensor layers 302 are deposited on top of a magnetic shield 304. This shield can be a material such as CoFe or NiFe. However in the ELG area, the sensor material that makes up the ELG 504 in FIG. 6A is formed on top of an alumina ($Al_2O_3$) fill layer 602 and not the shield structure 304. Because the sensor material in both regions 302, 504 is not entirely opaque, the different reflectivities of the underlying layers 304, 602 affect the photolithographic process used to define the back edges 604, 606. This causes an undesirable misalignment of the back edges 604, 606, which in turn leads to inaccurate definition of the ABS location and variation in the stripe height SH of the sensor stack 302 (FIG. 4).

Another problem arises as a result of the sensor tail 402 discussed previously with regard to FIG. 4. Because the ELG 504 is formed (at least partially) of the same material that makes up the sensor stack 302, the processes used to form the sensor 302 with a tail 402 also result in an ELG 504 having a corresponding tail 604. While the tail 402 on the sensor is desirable for maximizing pinning robustness, the tail 604 on the ELG 504 is undesirable in that it reduces the effectiveness of the ELG in accurately determining the distance to which lapping has progressed with regard to the sensor stripe height SH.

The present invention, as described herein below, overcomes both of these challenges to form an ELG by a process that is does not have lithographic patterning issues with regard to differing reflectivities in the sensor and ELG areas and that also allows the sensor to be formed with a tail for improved pinning, while forming the ELG with no such tail for improved lapping measurement.

Figure 7:
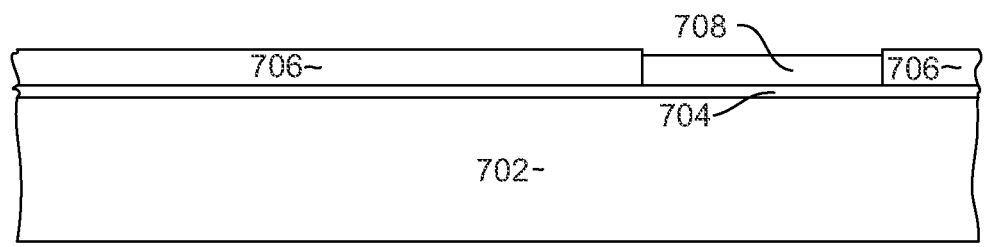
FIGS. 7-25 are views of a magnetic read head and electrical lapping guide (ELG) in various intermediate stages of manufacture, illustrating a method for manufacturing a magnetic head according to an embodiment of the invention.

A method for manufacturing a magnetoresistive sensor according to an embodiment of the invention is described with reference to FIGS. 7 through 25. With particular reference to FIG. 7, a substrate 702 such as alumina ($Al_2O_3$) is provided, preferably with a planar upper surface. An electrically conductive, electroplating seed layer 704 is deposited over the substrate 702 by a process such as sputter deposition or some similar method. Then, an electroplating frame mask 706 is formed having an opening that is configured to define a magnetic shield on which a magnetoresistive sensor can be formed. A magnetic material 708 such as CoFe or NiFe is then electroplated into the opening in the mask 706, leaving a structure such as that shown in FIG. 7.

Figure 8:
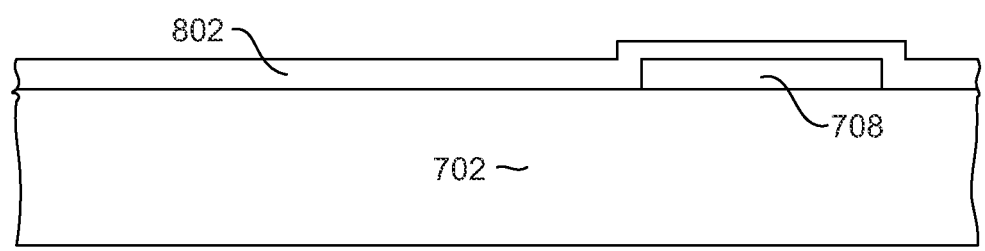
Figure 9:
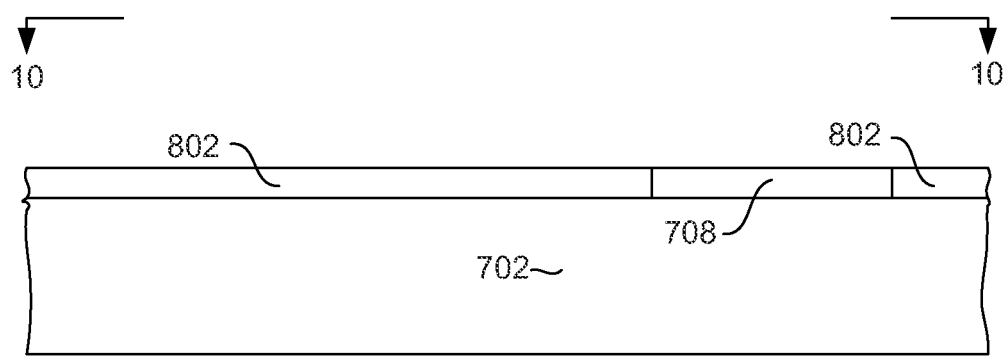
Figure 10:
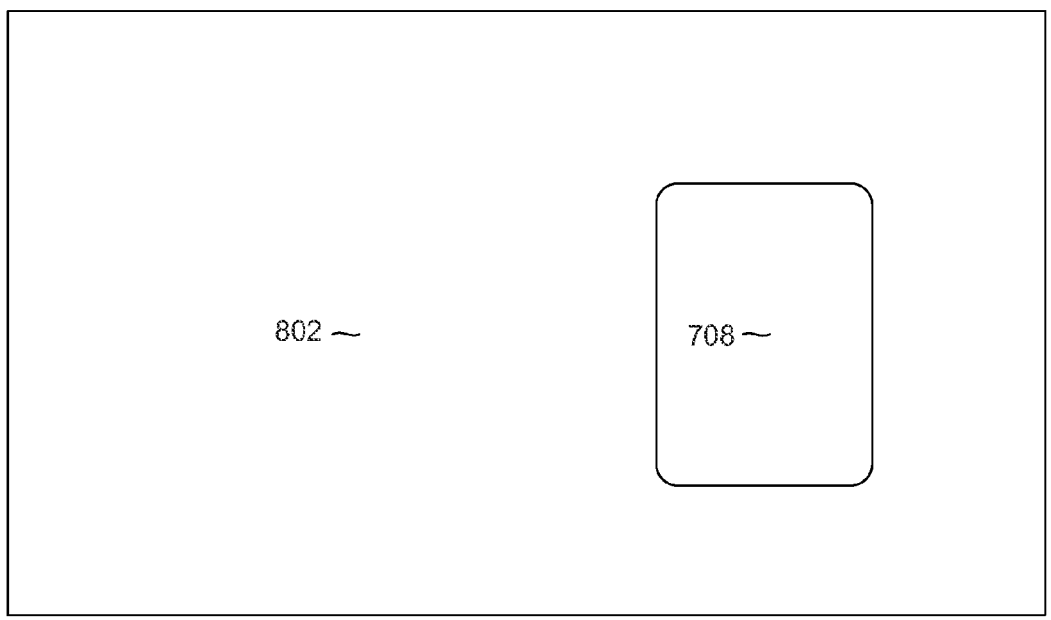

Then, with reference to FIG. 8, a non-magnetic fill layer 802 such as alumina is deposited. A chemical mechanical polishing process can then be performed to remove portions of the fill layer 802 that extend over the magnetic shield material 708 and to planarize the structures 708, 802, leaving a structure such as that shown in FIG. 9. FIG. 10 shows a top down view of the structure of FIG. 9, and shows a possible shape of the shield 708 in a sensor region of the wafer on which the materials are deposited.

Figure 11:
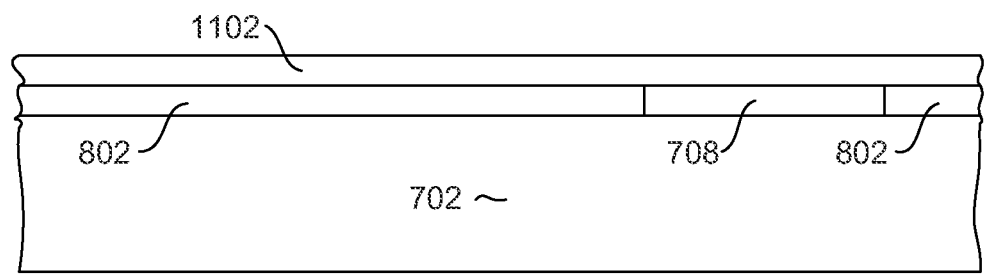
Figure 12:
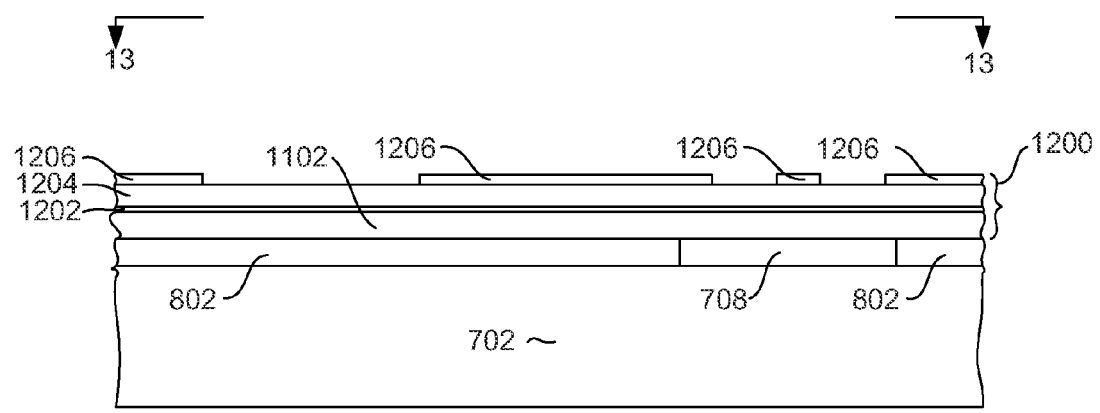
Figure 13:
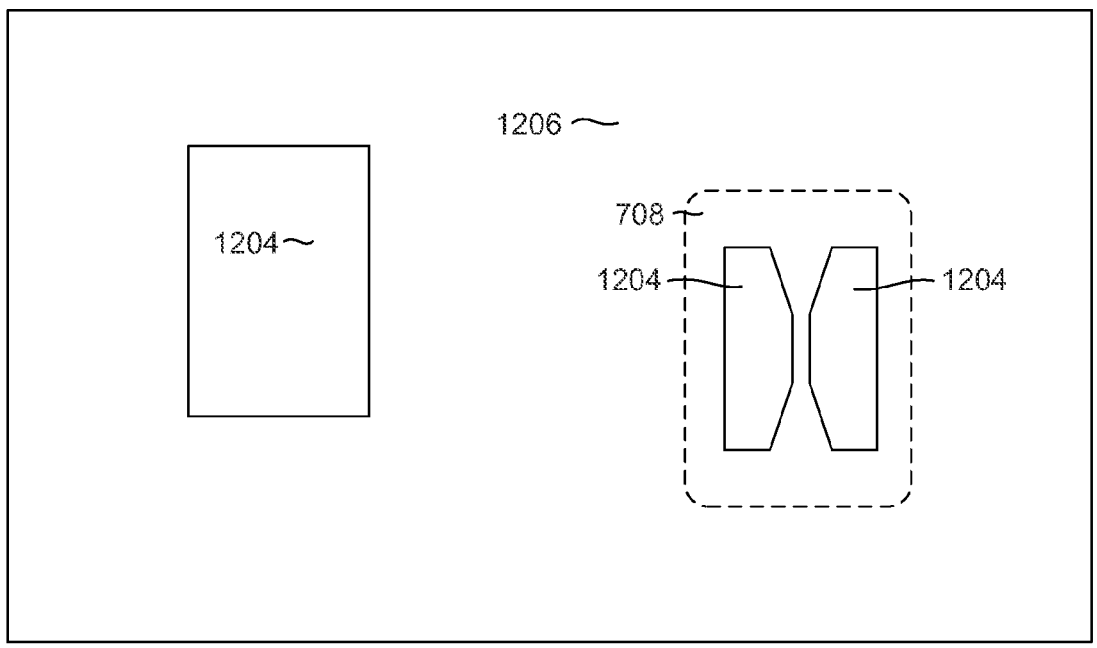

Then, with reference to FIG. 11, a series of layers of sensor material 1102 is deposited. The sensor material 1102 can correspond to the layers of the sensor stack 302 described above with reference to FIGS. 3 and 4, but could include other layers or types of sensors as well. Then, with reference to FIG. 12, a series of first mask layers 1200 are deposited. The mask layers can include a hard mask layer 1202 formed directly over the sensor material 1102. The hard mask can be a material such as carbon or diamond like carbon (DLC). An image transfer layer 1204 can be deposited over the hard mask layer 1202 and can be constructed of a soluble polyimide material such as DURIMIDE® and can be a material that can function as an antireflective coating as well as an image transfer layer. The mask layers also include a photoresist layer 1206 deposited over the image transfer layer. An optional upper hard mask (not shown) can optionally be deposited between the image transfer layer and the photoresist layer, depending on design conditions. The photoresist layer 1206 is photolithographically patterned and developed to form it with openings in a sensor area for defining a sensor track width (and also a location of hard bias layers) and in an Electrical Lapping Guide (ELG) area for defining a location of a for providing a location for lapping guide material as will be seen. FIG. 13 shows a top down view as seen from line 13-13 of FIG. 12 and better shows a possible configuration of the openings in the photoresist mask 1206. In FIG. 13, the dashed line indicates the location of the shield material 708 hidden beneath the mask hard mask and image transfer layers 1202, 1204. After the photoresist layer 1206 has been patterned as described above, a process such as Reactive Ion Etching (RIE) can be performed to remove portions of the image transfer layer that are not protected by the mask 1206 to transfer the image of the photoresist mask 1206 onto the underlying image transfer layers 1204, 1202, and leaving a structure such as that shown in FIG. 14.

Figure 14:
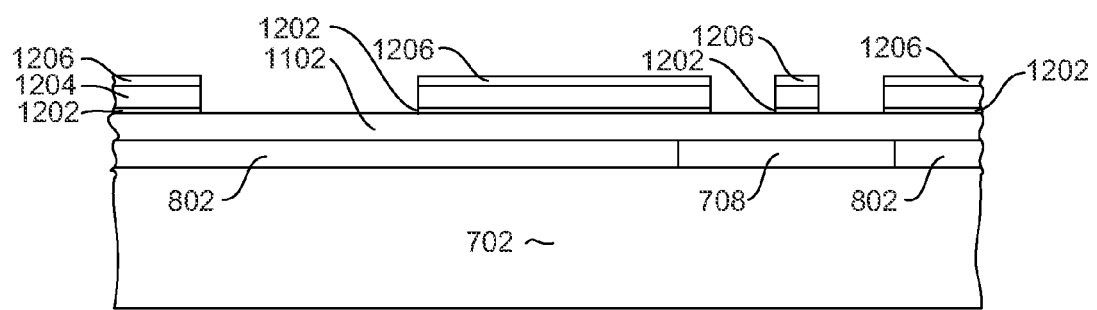
Figure 15:
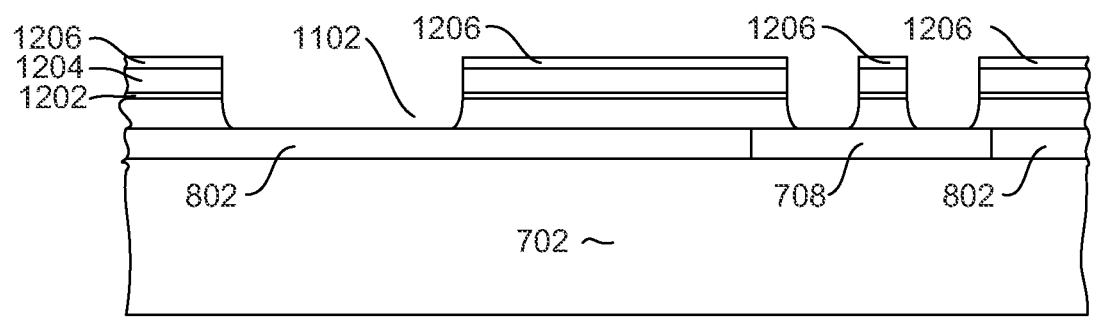

Then, with the mask layers 1204, 1206 as shown in FIG. 14, an ion milling is performed to remove portions of the sensor material 1102 that are not protected by the mask layers 1204, 1206, leaving a structure such as that shown in FIG. 15.

Figure 16:
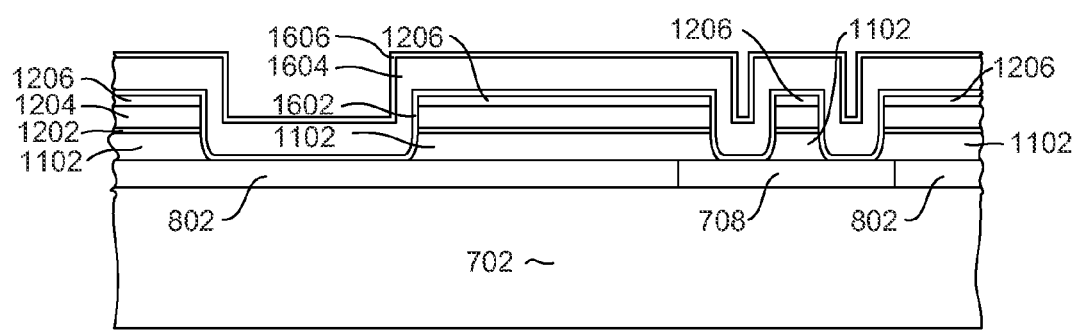

With reference now to FIG. 16 a thin layer of dielectric material 1602 is deposited. This layer 1602 is preferably alumina and is preferably deposited by a conformal deposition process such as atomic layer deposition. Then, a layer of hard magnetic material such as CoPt or CoPtCr 1604 is deposited over the thin insulation layer 1602. The hard bias layer 1604 can also include one or more seed layers and/or a capping layer which are not shown here for purposes of clarity. A layer of material that is resistant to chemical mechanical polishing (CMP stop layer) 1606 is deposited over the hard magnetic material 1604. The CMP stop material 1606 can be carbon or diamond like carbon (DLC).

Figure 17:
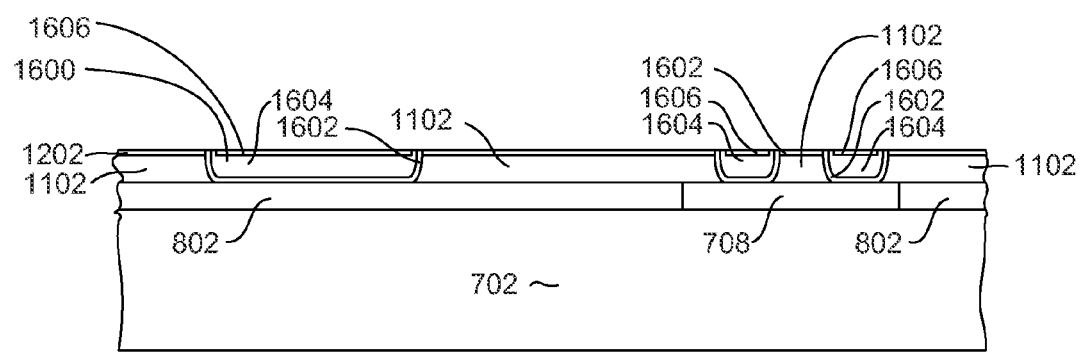
Figure 18:
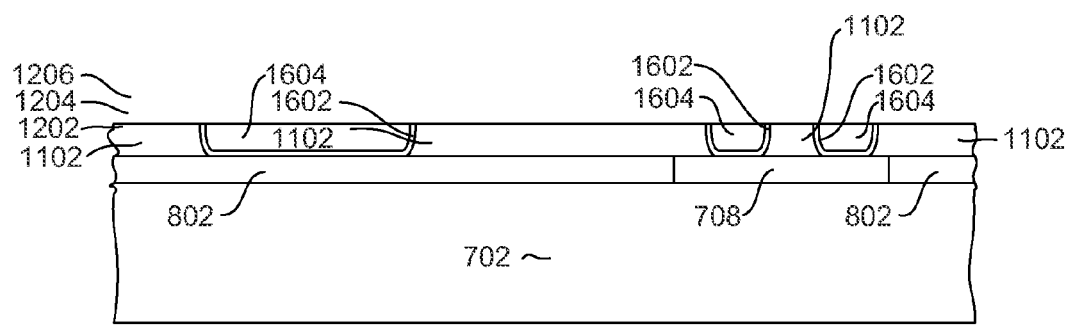
Figure 19:
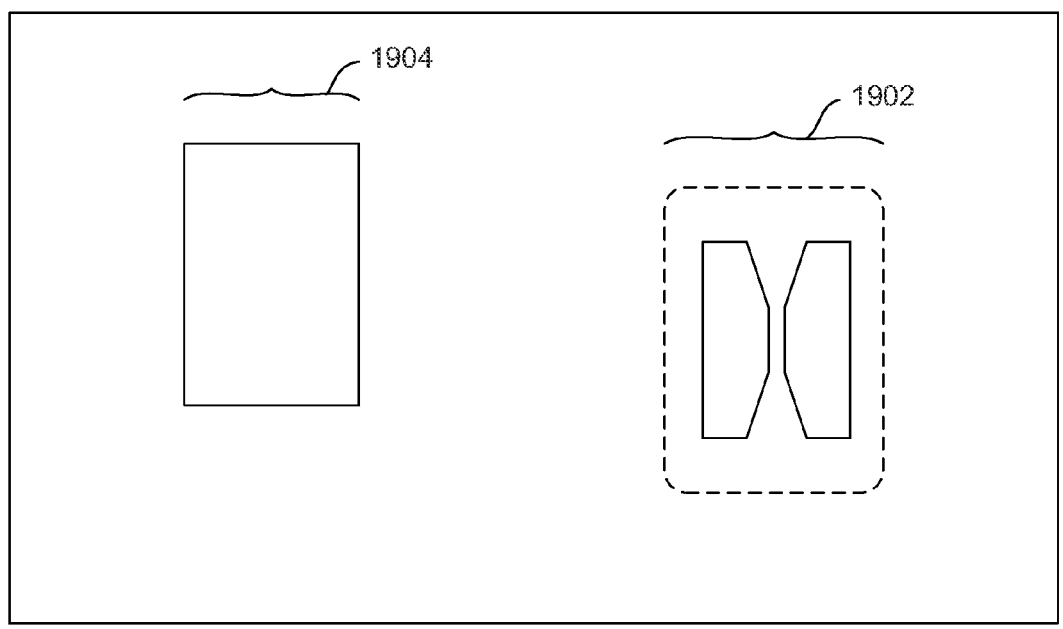

A chemical mechanical polishing can then be performed, stopping at the hard mask layer 1202 and CMP stop layer 1606, thereby leaving a planarized structure as shown in FIG. 17. A quick reactive ion etching can then be performed to remove the remaining hard mask 1202 and CMP stop layer 1606, leaving a structure as shown in FIG. 18. FIG. 19 shows a top down view of the structure of FIG. 18. The shield 708 is shown in dashed line to indicate that it is hidden beneath the sensor material 1102 and hard bias material 1604. As can be seen in FIG. 18 the above processes result in hard bias material being formed in a sensor region 1902 and also in an ELG region 1904 removed from the sensor region 1902 to some extent.

Figure 20:
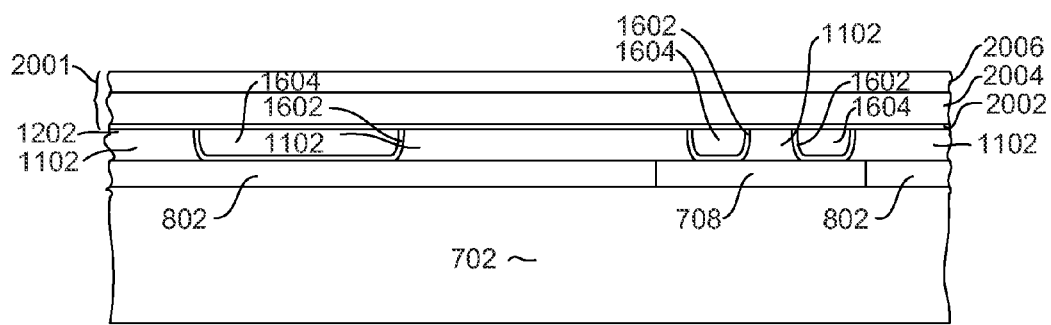
Figure 21:
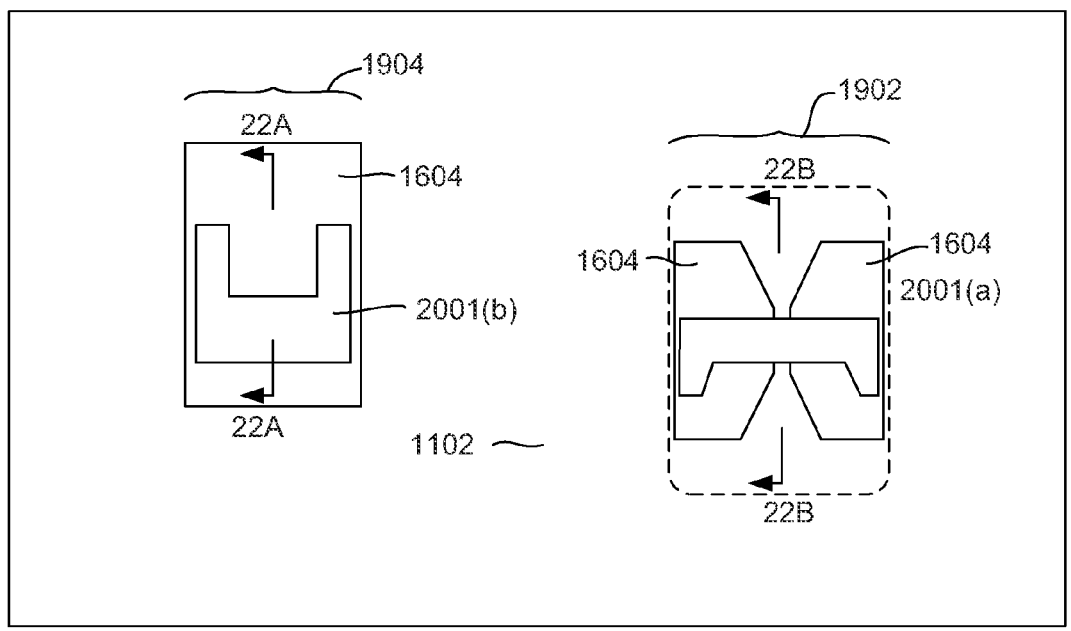

With reference now to FIG. 20, a second series of mask layers 2001 is deposited and can include a CMP resistant hard mask 2002 such as carbon or diamond like carbon, an image transfer layer 2004 that can be a soluble polyimide material such as DURIMIDE®, and a photoresist layer 2006. The photoresist layer is photolithographicaly patterned and developed to from a mask, and the image of the patterned photoresist mask 2006 is transferred onto the underlying mask layers 2002, 2004 by one or more of reactive icon etching and/or ion milling. The finished mask 2001 has a shape that can be seen more clearly with reference to FIG. 21. As seen in FIG. 21, the mask 2001 has a sensor stripe height defining portion 2001(a) that is constructed in the sensor region 1902 and is configured to define a strip height of the sensor. The mask 2001 also has an ELG defining portion 2001(b) that is formed in the ELG area 1904 and that is configured to define the shape of an ELG. After mask 2001 has been formed, an ion milling process is performed to remove sensor material 1102 and hard bias material 1604 that is not protected by the mask 2001.

It should be pointed out at this point that, the mask portions 2001(a) and 2001(b) are patterned primarily over the magnetic hard bias material 1604. It will be recalled that prior art processes, wherein patterning of the sensor stripe height and ELG were performed on senor material, suffered from poor, inaccurate definition of the ELG as a result of the differences in reflectivity during photolithography. This is because the sensor material is somewhat transparent, so the different reflectivities of the under-lying shield and alumina fill layers resulted in different reflectivities in the sensor and ELG regions during photolithography. In the present invention, however, the photolithography is performed on hard bias material. Although the substrates beneath the hard bias material 1604 in the sensor and ELG regions 1902, 1904 are still different (shield material and alumina), the hard bias material 1604 is much more opaque than the sensor material 1102. This means that the different reflectivities of the substrate do not affect the photolithography. Therefore, the problems associated with the prior art (with regard to different reflectivities in during patterning of the ELG) are effectively mitigated.

Figure 22A:
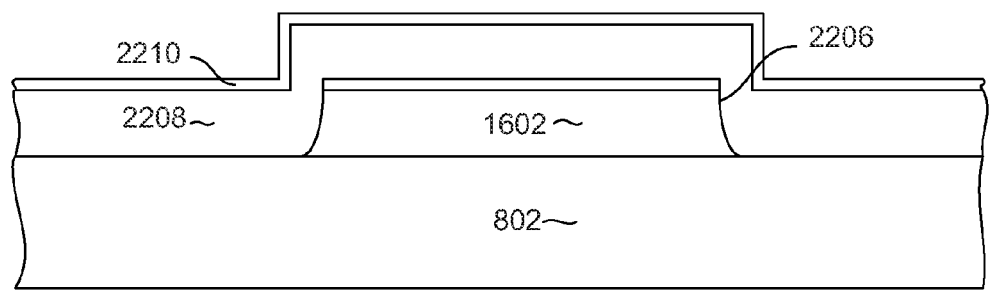
Figure 22B:
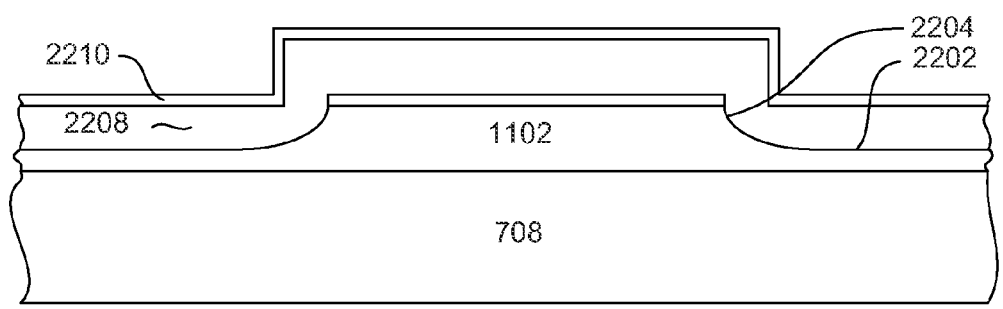

FIG. 22A shows a side cross sectional view of the structure of FIG. 21 in the ELG region 1904 as seen from line 22A-22A, and, similarly, FIG. 22B shows a side cross sectional view of the structure of FIG. 21 in the sensor region 1902 as seen from line 22B-22B. The cross section of FIG. 22B shows the sensor material 1102 in the sensor region after the ion milling has been performed. This ion milling is a stripe height defining ion milling. As can be seen, the ion milling can be terminated before all of the sensor material has been removed, leaving a desired tail 2202 of sensor material behind the stripe height defining back edge 2204 of the sensor material 1102. As discussed above, this tail 2202 of sensor material allows all or a portion of the AFM layer 320 (FIG. 4) structure 308 to extend beyond the stripe height defining back edge 2204 (FIG. 22B), which greatly enhances pinning strength.

On the other hand, it can be seen in FIG. 22A that even though the ion milling of the sensor material 1102 left a tail as shown in FIG. 22B, the hard bias material 1604 that makes up the ELG has been removed all of the way to the substrate 802. This is because the hard bias material 1602 is removed more rapidly by the ion milling than are the materials making up the sensor layers 1102. The ELG formed by the layer 1602, therefore, has a back edge 2206 that extends all of the way to the substrate 802. This allows the ELG 1602 to have a well defined back edge which cat be used to clearly identify the point at which lapping should be terminated to accurately define the stripe height of the sensor, as will be seen.

With continued reference to FIGS. 22A and 22B a non-magnetic, dielectric fill layer 2208 is deposited full film. This material 2208 is preferably alumina ($Al_2O_3$) to a thickness that is at least as thick as the sensor material 1602. A layer of material that is resistant to chemical mechanical polishing (second CMP stop layer) 2210 is then deposited over the fill layer 2208. The second CMP stop layer 2210 can be a carbon or Diamond Like Carbon (DLC).

Figure 23A:
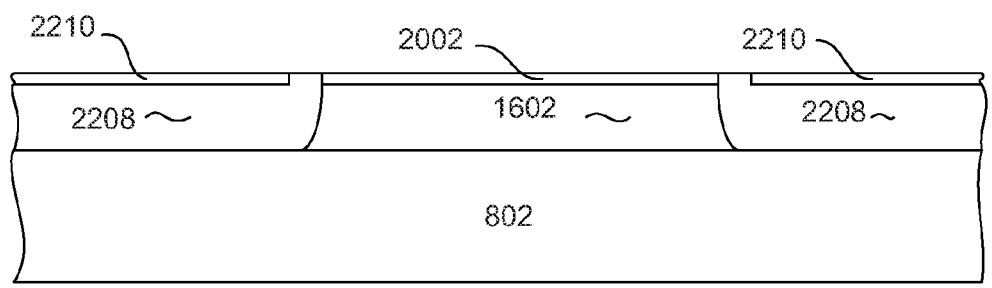
Figure 23B:
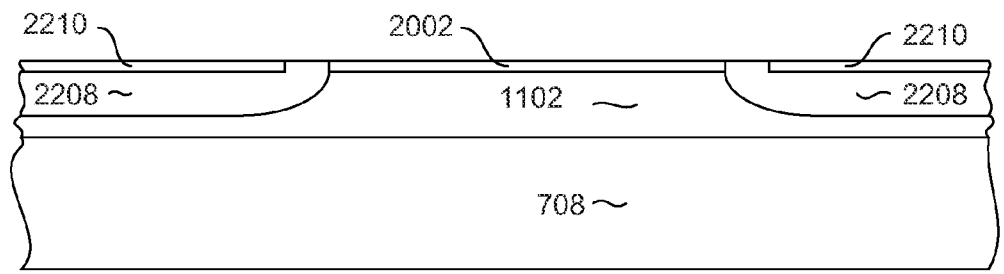

A chemical mechanical polishing process is then performed to planarize the structure, leaving a structure as shown in FIGS. 23A and 23B. A quick reactive ion etching is then performed to remove the remaining CMP stop layers 2002, 2210, leaving a structure such as that shown in FIGS. 24A and 24B.

Figure 24A:
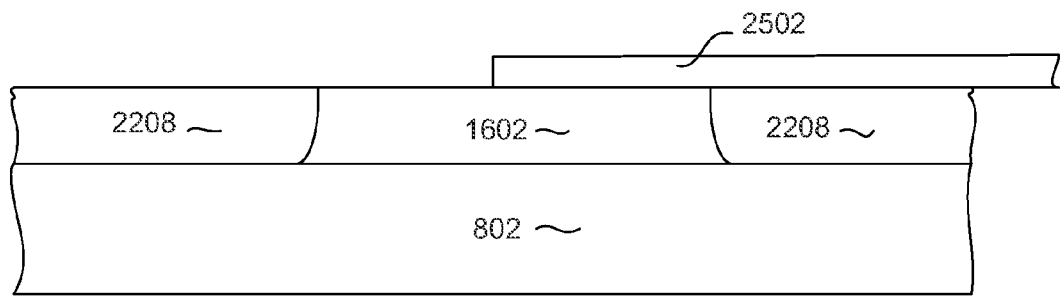
Figure 24B:
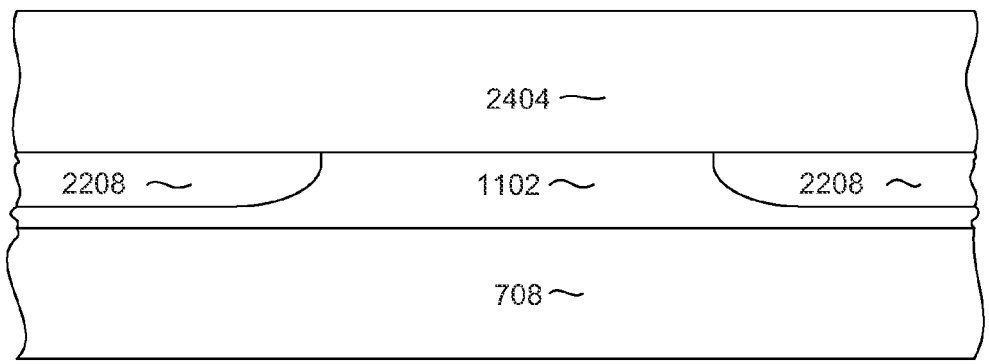
Figure 25:
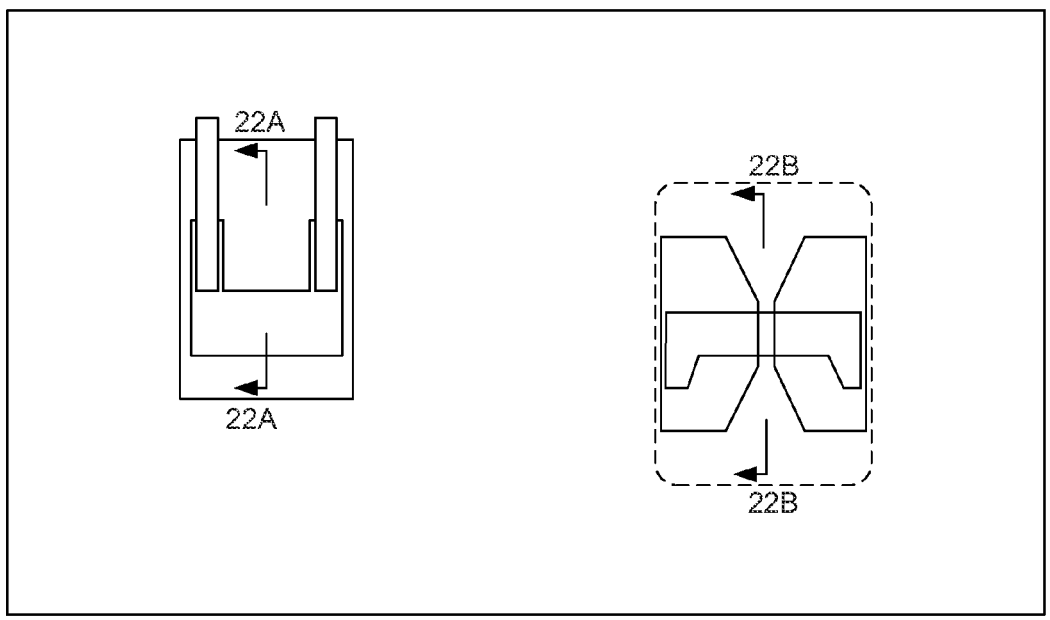

FIG. 25 shows a top down view of the structures of FIGS. 24A and 24B. As shown in FIGS. 25 and 24A a pair of electrically conductive leads 2502, 2504 are formed over the end portions of the ELG 1602. These leads 2502, 2504 cal be used to measure the electrical resistance across the ELG 1602 during lapping to determine lapping progress. The leads 2502 can be formed by a liftoff process by forming a mask (not shown) having an opening that is configured to define the leads 2502, 2504, then sputter depositing an electrically conductive material and then lifting off the mask. With reference to FIG. 24B an upper shield 2404 can be formed over the sensor 1102, constructed of a magnetic, electrically conductive material such as NiFe or CoFe and deposited by electroplating.

With reference again to FIG. 25, once the head (including the write head) has been completely formed on a wafer, the wafer is sliced into rows of heads. Then, a lapping operation is performed from a direction indicated by arrows 2506 until the desired air bearing surface plane has been reached. The air bearing surface plane is indicated in FIG. 25 at the dashed line denoted "ABS". The electrical resistance across the lapping guide 1602 is measured during lapping. As the lapping progresses, lapping guide material will be removed accordingly, resulting in a corresponding increase in electrical resistance across the lapping guide. When the desired electrical resistance has been reached, indicating that the ABS plane has been reached, lapping is terminated.

It can be seen then, that a novel method of manufacturing a lapping guide from the material used to form the hard bias layers for the sensor can eliminate the problems associated with lapping guide tail formation and also with regard to differences in reflectivity during photolithographic patterning of the lapping guide and sensor. This advantageously provides a much higher degree of accuracy in the lapping operation used to define the stripe height of the sensor.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic sensor, comprising:
   depositing a magnetic sensor material;
   forming a first mask configured to define a sensor width;
   performing a first ion milling to remove portions of the sensor material that are not protected by the first mask, thereby defining a sensor width;
   depositing a magnetic bias material;
   forming a second mask, the second mask being configured to define a sensor back edge and an electrical lapping guide back edge; and
   performing a second ion milling to remove portions of the sensor material and magnetic bias material that are not protected by the second mask, thereby defining a back edge of an electrical lapping guide and a back edge of the sensor.

2. The method as in claim 1, wherein the first mask has an opening in an electrical lapping guide area and wherein the first ion milling removed sensor material exposed through the opening in the first mask in the electrical lapping guide area.

3. The method as in claim 1, wherein the second ion milling is performed sufficiently to extend all of the way through the magnetic bias material, but to not extend all of the way through the sensor material, thereby forming a tail of sensor material that extends from the back edge of the sensor.

4. The method as in claim 1 wherein the magnetic bias material is a resistive, electrically conductive hard magnetic.

5. The method as in claim 1 wherein the magnetic bias material comprises CoPt or CoPtCr.

6. The method as in claim 1 further comprising, after performing the first ion milling, but before depositing the magnetic bias material, depositing a non-magnetic, electrically insulating layer.

7. A method for manufacturing a magnetic sensor, comprising:
   forming an electrically conductive magnetic shield in a sensor region and a non-magnetic, electrically insulating fill material in an electrical lapping guide region;
   depositing a sensor material;
   forming a first mask, the mask being configured to define a sensor width in a sensor region and configured to leave sensor material exposed in an electrical lapping guide region;
   performing a first ion milling to define a sensor width in the sensor region and to remove sensor material in the electrical lapping guide region;
   depositing a magnetic bias material;
   forming a second mask that is configured to define a sensor back edge in the sensor region and an electrical lapping guide back edge in the electrical lapping guide region; and
   performing a second ion milling to remove sensor material and magnetic bias material that is not covered by the second mask to define a back edge of an electrical lapping guide and a back edge of the sensor.

8. The method as in claim 7 wherein the first mask is configured in the sensor region with first and second openings at first and second sides of a desired sensor, an area over the desired sensor being covered with a portion of the first mask that has a width to define the sensor width.

9. The method as in claim 7 wherein the magnetic bias material defines first and second hard bias structures in the sensor region and defines an electrical lapping guide in the electrical lapping guide region.

10. The method as in claim 7, wherein the magnetic bias material comprises an electrically resistive hard magnetic material.

11. The method as in claim 7, wherein the magnetic bias material comprises CoPt or CoPtCr.

12. The method as in claim 7 wherein the second ion milling is performed sufficiently to remove all of the magnetic bias material exposed by the second mask, but is terminated prior to removal of all of the sensor material exposed by the second mask.

13. The method as in claim 12, wherein the sensor material includes a layer of anti-ferromagnetic material and wherein the second ion milling leaves at least a portion of the layer of anti-ferromagnetic material extending from the back edge of the sensor material.

* * * * *

UNITED STATES PATENT AND TRADEMARK OFFICE
CERTIFICATE OF CORRECTION

Page 1 of 1

PATENT NO.       : 8,778,198 B2
APPLICATION NO.  : 13/172739
DATED            : July 15, 2014
INVENTOR(S)      : Quang Le et al.

It is certified that error appears in the above-identified patent and that said Letters Patent is hereby corrected as shown below:

In the Specification:

Column 6, line 41 replace "lavers" with --layers--;

Column 7, line 41 replace "reactive icon" with --reactive ion--;

Column 8, line 31 replace "edge which cat" with --edge which can--;

Column 8, line 51 replace "2504 cal" --2504 can--.

Signed and Sealed this
Fourteenth Day of July, 2015

Michelle K. Lee
*Director of the United States Patent and Trademark Office*